(12) United States Patent
Chun et al.

(10) Patent No.: US 10,115,816 B2
(45) Date of Patent: Oct. 30, 2018

(54) SEMICONDUCTOR DEVICE AND MANUFACTURING METHOD THEREOF

(71) Applicant: Hyundai Motor Company, Seoul (KR)

(72) Inventors: Dae Hwan Chun, Gyeonggi-do (KR);
Youngkyun Jung, Seoul (KR);
Nackyong Joo, Gyeonggi-do (KR);
Junghee Park, Gyeonggi-do (KR);
Jong Seok Lee, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 15/187,485

(22) Filed: Jun. 20, 2016

(65) Prior Publication Data

US 2017/0170307 A1    Jun. 15, 2017

(30) Foreign Application Priority Data

Dec. 11, 2015   (KR) .................. 10-2015-0177102

(51) Int. Cl.
*H01L 29/78*   (2006.01)
*H01L 29/16*   (2006.01)
(Continued)

(52) U.S. Cl.
CPC ........ *H01L 29/7805* (2013.01); *H01L 21/047* (2013.01); *H01L 29/1608* (2013.01); *H01L 29/66068* (2013.01); *H01L 29/7813* (2013.01)

(58) Field of Classification Search
CPC ......... H01L 29/41741; H01L 29/41775; H01L 29/41783; H01L 29/4236; H01L 29/42372;
(Continued)

(56) References Cited

U.S. PATENT DOCUMENTS

| | | | |
|---|---|---|---|
| 7,863,685 B2 | 1/2011 | Hshieh | |
| 2009/0072241 A1* | 3/2009 | Harris | H01L 29/1608 257/77 |

(Continued)

FOREIGN PATENT DOCUMENTS

| | | |
|---|---|---|
| JP | 2005-108926 A | 4/2005 |
| KR | 10-0158608 B1 | 12/1998 |

(Continued)

*Primary Examiner* — Matthew Reames
*Assistant Examiner* — John Bodnar
(74) *Attorney, Agent, or Firm* — Mintz Levin Cohn Ferris Glovsky and Popeo, P.C.; Peter F. Corless

(57) ABSTRACT

A semiconductor device is provided. The device includes an n− type layer with a trench disposed in a first surface of an n+ type silicon carbide substrate. An n+ type region and a first p type region are disposed at the n− type layer and at a lateral surface of the trench. A plurality of second p type regions are disposed at the n− type layer and spaced apart from the first p type region. A gate electrode includes a first and a plurality of second gate electrodes disposed at the trench and extending from the first gate electrode, respectively. A source electrode is disposed on and insulated from the gate electrode. A drain electrode is disposed on a second surface of the n+ type silicon carbide substrate. The source electrode contacts the plurality of second p type regions spaced apart with the n− type layer disposed therein.

7 Claims, 11 Drawing Sheets

(51) Int. Cl.
*H01L 29/66* (2006.01)
*H01L 21/04* (2006.01)

(58) Field of Classification Search
CPC ........... H01L 29/42376; H01L 29/4238; H01L 29/7806; H01L 29/7839; H01L 29/7805; H01L 29/7813; H01L 29/1608
See application file for complete search history.

(56) References Cited

U.S. PATENT DOCUMENTS

| 2012/0313139 | A1* | 12/2012 | Matsuura | H01L 29/36 257/139 |
| 2014/0021484 | A1* | 1/2014 | Siemieniec | H01L 21/049 257/77 |
| 2014/0175559 | A1 | 6/2014 | Hung et al. | |

FOREIGN PATENT DOCUMENTS

| KR | 10-0275207 B1 | 1/2001 |
| KR | 2001-0024977 A | 3/2001 |
| KR | 2004-0036914 A | 5/2004 |
| KR | 2009-0026747 A | 3/2009 |
| KR | 10-2012-0091231 A | 8/2012 |
| KR | 10-1187084 B1 | 9/2012 |

* cited by examiner

SEMICONDUCTOR DEVICE AND MANUFACTURING METHOD THEREOF

CROSS-REFERENCE TO RELATED APPLICATION

This application claims priority to and the benefit of Korean Patent Application No. 10-2015-0177102 filed in the Korean Intellectual Property Office on Dec. 11, 2015, the entire contents of which are incorporated herein by reference.

BACKGROUND (a) Technical Field

The present invention relates to a semiconductor device including a silicon carbide (SiC), and a manufacturing method thereof.

(b) Description of the Related Art

Typically, a power semiconductor device is required to have low turn-on resistance or a low saturated voltage to reduce power loss in a conductive state when a substantial amount of current flows. Further, the power semiconductor device has an inverse directional high voltage at a p-type and n-type (PN) conjunction thereof, which may be applied to opposite terminals of the power semiconductor device when it is turned off or when a switch is turned off to have a high breakdown voltage characteristic. When various power semiconductor devices that satisfy electrical and physical conditions are packaged in one module the number of semiconductor devices included in the packaged module and electrical specifications thereof may vary based on the system conditions.

Generally, a three-phase power semiconductor module is used to generate a Lorentz force for driving a motor. In particular, the three-phase power semiconductor module adjusts a current and power applied to the motor to determine a driven state of the motor. Although conventional silicon insulated gate bipolar transistors (IGBTs) and silicon diodes have been included and used in three-phase semiconductor modules, the three-phase semiconductor module typically include silicon carbide (SiC) metal oxide semiconductor field effect transistors (MOSFETs) and silicon carbide diodes to minimize power consumption and increase a switching speed thereof. When the silicon IGBTs or silicon carbide MOSFETs are connected to separate diodes, a plurality of wires are required for the connection. Since parasitic capacitance and inductance occur due to the plurality of wires, the switching speed of the module may be reduced.

The above information disclosed in this section is merely to enhance the understanding of the background of the invention and therefore it may contain information that does not form the prior art that is already known in this country to a person of ordinary skill in the art.

SUMMARY

The present invention provides a silicon carbide (SiC) semiconductor device including a MOSFET region and a diode region. In an exemplary embodiment of the present invention a semiconductor device may include an n− type layer disposed in a first surface of an n+ type silicon carbide substrate a trench disposed in the n− type layer and an n+ type region and a first p type region disposed at the n− type layer and at a lateral surface of the trench. The semiconductor device may further include a plurality of second p type regions disposed at the n− type layer and spaced apart from the first p type region. A gate electrode may include a first gate electrode disposed at the trench and a plurality of second gate electrodes that extend from the first gate electrode. A source electrode may be disposed on the gate electrode and may be insulated from the gate electrode. A drain electrode may be disposed on a second surface of the n+ type silicon carbide substrate. The plurality of second p type regions may be spaced apart from each other. The source electrode may contact the plurality of second p type regions and the n− type layer may be disposed between the plurality of second p type regions.

The plurality of second gate electrodes may extend from the first gate electrode to an upper portion of the second p type region adjacent to the first p type region. The semiconductor device may further include a gate insulating layer disposed under the first gate electrode and the plurality of second gate electrodes. The gate insulating layer may be disposed between the first gate electrode and the trench, and between the plurality of second gate electrodes and the n+ type region, the first p type region, and a upper portion of the second p type region adjacent to the first p type region. The plurality of second gate electrodes may be spaced apart from each other.

The n− type layer, the first p type region, and the plurality of second p type regions may be disposed between the plurality of second gate electrodes. A Schottky electrode may contact the n− type layer disposed between the plurality of second gate electrodes, the first p type region, and the plurality of second p type regions. The first p type region may surround a corner of the trench, and may extend to a bottom surface of the corner of the trench.

An exemplary embodiment of the present invention provides a manufacturing method of a semiconductor device that may include forming an n− type layer on a first surface of an n+ type silicon carbide substrate, forming a first preparation p type region and a plurality of second p type regions that are spaced apart from each other by injecting p ions into the n− type layer and forming a preparation n+ type region by injecting n+ ions into the first preparation p type region. The method may further include forming a trench by etching a portion of the preparation n+ type region, a portion of the first preparation p type region, and a portion of the n− type layer, completing a first p type region by injecting the p ions into a lateral surface of the trench and completing an n+ type region by injecting the n+ ions into the lateral surface of the trench.

Furthermore, the method may include forming a gate insulating layer on the n+ type region, the first p type region, and the second p type region adjacent to the first p type region, and at the trench; forming a gate electrode on the gate insulating layer; forming an oxide layer on the gate electrode, forming a source electrode on the oxide layer and the plurality of second p type regions, and forming a drain electrode on a second surface of the n+ type silicon carbide substrate. The plurality of second p type regions may be spaced apart from each other, and the source electrode may be formed on the n− type layer disposed between the plurality of second p type regions.

The gate electrode may include a first gate electrode formed within the trench and a second gate electrode that extends from the first gate electrode and may be formed in portions that correspond to the n+ type region, the first p type region, and the second p type region adjacent to the first p type region. In particular, the first p type region may include the p ions that may be injected by a tilt ion injecting method.

The n+ type region may include n+ ions that may be injected by a tilt ion injecting method.

According to an exemplary embodiment of the present invention, the semiconductor device does not require wires that connect MOSFET devices and diode devices since the MOSFET region and the diode region may be included therein. Accordingly, a size of the semiconductor device may be reduced. Further, according to the exemplary embodiment of the present invention, since the MOSFET region and the diode region may be included in one semiconductor device without a wire, a switching speed of the semiconductor device may be improved.

BRIEF DESCRIPTION OF THE DRAWINGS

The above and other objects, features and advantages of the present invention will be more clearly understood from the following detailed description when taken in conjunction with the accompanying drawings, in which.

DETAILED DESCRIPTION

Figure 1:
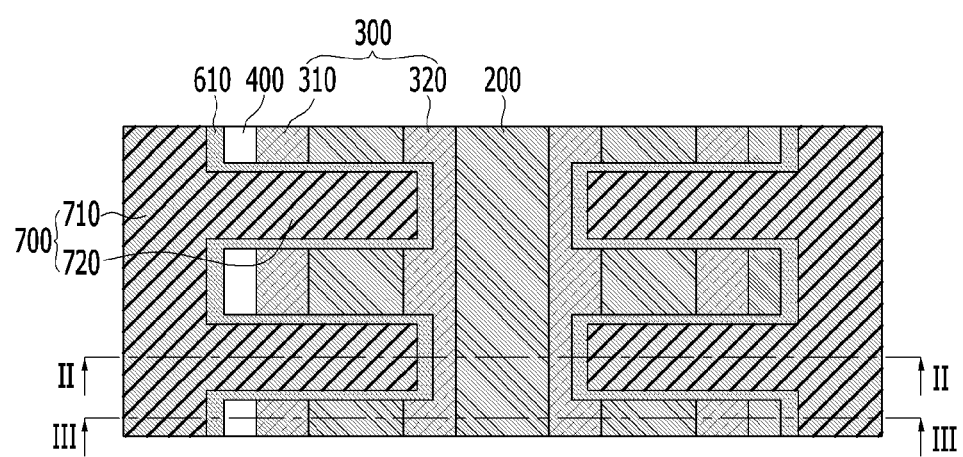
FIG. 1 illustrates an exemplary layout view of a semiconductor device according to an exemplary embodiment of the present invention.

The present disclosure will be described more fully hereinafter with reference to the accompanying drawings, in which exemplary embodiments of the disclosure are shown. However, it is to be understood that the disclosure is not limited to the disclosed embodiments, but, on the contrary, is intended to cover various modifications. As those skilled in the art would realize, the described exemplary embodiments may be modified in various different ways, all without departing from the spirit or scope of the present disclosure. On the contrary, the invention is intended to cover not only the exemplary embodiments, but also various alternatives, modifications, equivalents and other embodiments, which may be included within the spirit and scope of the invention as defined by the appended claims.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, in order to make the description of the present invention clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

It is understood that the term "vehicle" or "vehicular" or other similar term as used herein is inclusive of motor vehicle in general such as passenger automobiles including sports utility vehicles (SUV), buses, trucks, various commercial vehicles, watercraft including a variety of boats, ships, aircraft, and the like and includes hybrid vehicles, electric vehicles, combustion, plug-in hybrid electric vehicles, hydrogen-powered vehicles and other alternative fuel vehicles (e.g. fuels derived from resources other than petroleum).

Figure 2:
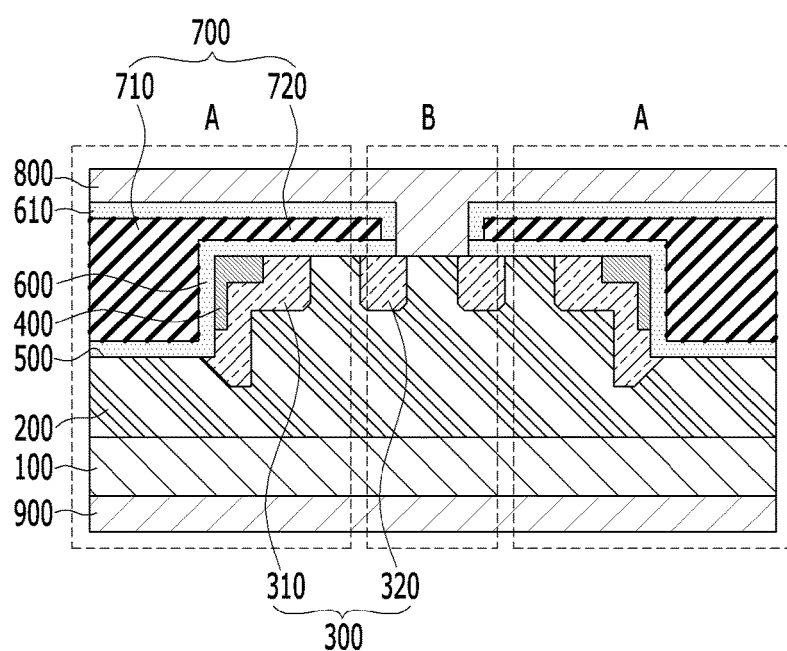
FIG. 2 illustrates an exemplary cross-sectional view taken along line II-II of FIG. 1 according to an exemplary embodiment of the present invention.
Figure 3:
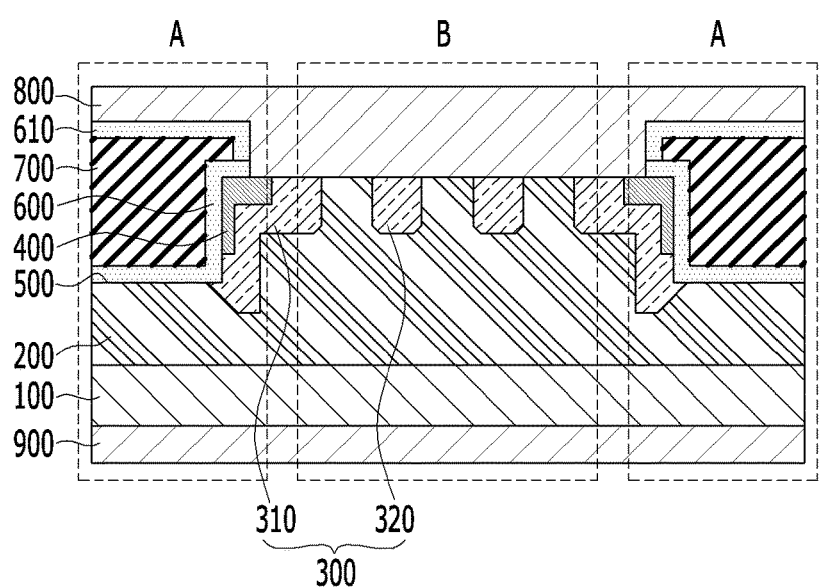
FIG. 3 illustrates an exemplary cross-sectional view taken along line III-III of FIG. 1 according to an exemplary embodiment of the present invention.

FIG. 1 illustrates an exemplary layout view of a semiconductor device according to an exemplary embodiment of the present invention. FIG. 2 illustrates an exemplary cross-sectional view taken along line II-II of FIG. 1. FIG. 3 illustrates an exemplary cross-sectional view taken along line of III-III FIG. 1. Referring to FIGS. 1 to 3, a semiconductor device according to the present exemplary embodiment may include a metal oxide silicon field effect transistor (MOSFET) region (A) and a diode region (B) that may be positioned adjacent to each other.

A structure of the semiconductor device according to the present exemplary embodiment will now be described in detail. The semiconductor device according to the present exemplary embodiment may include an n+ type silicon carbide substrate 100, an n− type layer 200, a p type region 300, an n+ type region 400, a gate electrode 700, a source electrode 800, and a drain electrode 900.

The n− type layer 200 may be disposed on a first surface of the n+ type silicon carbide substrate 100, and a trench 500 may be disposed on the n− type layer 200. The p type region 300 may be disposed in the n−type layer 200 and may include a first p type region 310 disposed at a lateral surface of the trench 500 and a plurality of second p type regions 320 disposed in the diode region (B). The first p type region 310 and the plurality of second p type regions 320 may be spaced apart from each other. Further, the plurality of second p type regions 320 may be spaced apart from each other.

The first p type region 310 may surround a corner of the trench 500, and may extend to a bottom surface of the corner of the trench 500. Due to such a structure, an electric field may be concentrated at an upper portion of the first p type region 310, and may prevent an electric field from being concentrated at the corner of the trench 500. Additionally, a p+ type region may be disposed on the first p type region 310. The n+ type region 400 may be disposed on a portion of the first p type region 310, and may contact a lateral surface of the trench 500. For example, top surfaces of the n− type layer 200, the first p type region 310, the second p type region 320, and the n+ type region 400 may be positioned on the same line.

A gate insulating layer 600 may be disposed in the trench 500. The gate insulating layer 600 may extend from the trench 500 to an upper surface of the second p type region 320 adjacent to the first p type region 310. In other words, the extended gate insulating layer 600 may cover upper surfaces of the n+type region 400 and the first p type region 310, and may cover a portion of an upper surface of the second p type region 320 adjacent to the first p type region 310.

The gate electrode 700 may be disposed on the gate insulating layer 600. The gate electrode 700 may include a first gate electrode 710 and a plurality of second gate electrodes 720 that extend from the first gate electrode 710. The first gate electrode 710 may be disposed on the gate insulating layer 600 disposed within the trench 500, and the second gate electrode 720 may be disposed on the extended gate insulating layer 600. For example, the first gate electrode 710 may be configured to function as a trench gate electrode, and the second gate electrode 720 may be configured to function as a planar gate electrode.

In an exemplary plane view, the first p type region 310, the plurality of second p type regions 320 and the n+ type region 400 may extend in a direction parallel to a direction in which the first gate electrode 710 extends. The plurality of second gate electrodes 720 are spaced apart from each other by a predetermined interval. In other words, the gate insulating layer 600 and the gate electrode 700 may not formed on the first p type region 310 between the plurality of second gate electrodes 720 and the second p type region 320. Further, the gate insulating layer 600 and the gate electrode 700 may not formed on a portion of the n+ type region 400 between the plurality of second gate electrodes 720.

An oxide layer 610 may be disposed on the gate electrode 700. The oxide layer 610 may cover a lateral surface of the gate electrode 700. The source electrode 800 may be disposed on the oxide layer 610 and the n− type layer 200 between the plurality of second p type regions 320. Further, the source electrode 800 may be disposed on the n− type layer 200 between the plurality of second gate electrodes 720, the first p type region 310, and the second p type region 320. The source electrode 800 may include a Schottky metal.

The drain electrode 900 may be disposed on a second surface of the n+ type silicon carbide substrate 100. Additionally, the drain electrode 900 may include an ohmic metal. For example, the second surface of the n+ type silicon carbide substrate 100 may be an opposite surface of the first surface of the n+ type silicon carbide substrate 100. The second gate electrode 720 may be disposed in a region as shown in FIG. 2, the n− type layer 200, the first p type region 310, the n+ type region 400, the first gate electrode 710, the second gate electrode 720, the source electrode 800, and the drain electrode 900 may form the MOSFET region (A), and the n− type layer 200, the second p type region 320, the source electrode 800, the drain electrode 900, and the source electrode 800 form the diode region (B). In the diode region (B), the source electrode 800 may contact the n− type layer 200 and the second p type region 320.

In a region in which the second gate electrode 720 is not disposed as shown in FIG. 3, the n− type layer 200, the first p type region 310, the n+ type region 400, the first gate electrode 710, the source electrode 800, and the drain electrode 900 may form the MOSFET region (A). Additionally, the n− type layer 200, the first p type region 310, the second p type region 320, the source electrode 800, the drain electrode 900, and the source electrode 800 may form the diode region (B). In the diode region (B), the source electrode 800 may contact the n− type layer 200, the first p type region 310, and the second p type region 320.

The MOSFET region (A) and the diode region (B) may be configured to separately operate based on a state in which a voltage is applied to the semiconductor device according to the present exemplary embodiment. When a voltage of about 0 V or a voltage equal to or less than a threshold voltage of the MOSFET is applied to the gate electrode, a positive voltage may be applied to the source electrode, and a voltage of about 0 V may be applied to the drain electrode, the diode region (B) operates. When a voltage equal to or greater than the threshold voltage of the MOSFET is applied to the gate electrode, a voltage of about 0 V may be applied to the source electrode, and a positive voltage may be applied to the drain electrode, to operate the MOSFET region (A). Here, the threshold voltage may be 2 V to 7 V, but the threshold voltage is not designated and may vary.

When the MOSFET region (A) operates, in the region in which the second gate electrode 720 is disposed as shown in FIG. 2, currents may be output from the n− type layer 200 under the first gate electrode 710 and from the n− type layer 200 under the second gate electrode 720. Further, in the region in which the second gate electrode 720 is not disposed as shown in FIG. 3, a current may be output from the n− type layer 200 under the first gate electrode 710. When the diode region (B) operates, in the region in which the second gate electrode 720 is disposed as shown in FIG. 2, a current may be output from the n− type layer 200 between the plurality of second p type regions 320. Further, in the region in which the second gate electrode 720 is not disposed as shown in FIG. 3, currents may be output from the n− type layer 200 between the first p type region 310 and the second p type region 320 and from the n− type layer 200 between the plurality of second p type regions 320.

Accordingly, when the semiconductor device is designed, in an area of the semiconductor device, by adjusting a ratio of an area occupied by the region in which the second gate electrode 720 is disposed as shown in FIG. 2 and an area occupied by the region in which the second gate electrode 720 is not disposed as shown in FIG. 3, an amount of the currents of the MOSFET region (A) and the diode region (B) may be adjusted. In particular, the semiconductor device according to the present exemplary embodiment does not require wires to connect the MOSFET devices and diode devices since the MOSFET region and the diode region may be included therein. Accordingly, a size of the semiconductor device may be reduced. Further, according to the embodiment of the present invention, since the MOSFET region and the diode region are included in one semiconductor device without a wire, a switching speed of the semiconductor device may be improved.

Hereinafter, characteristics of the semiconductor device according to the present exemplary embodiment, a typical diode device, and a typical MOSFET device will be compared and described with reference to Table 1. Table 1 represents respective simulation results for the semiconductor device according to the present exemplary embodiment, the typical diode device, and the typical MOSFET device. Comparative Example 1 is the typical diode device, and Comparative Example 2 is the typical MOSFET device. Areas of the semiconductor devices of Comparative Example 1 and Comparative Example 2 are respectively set to about 0.5 cm$^2$.

An area of the semiconductor device of the present exemplary embodiment may be set to about 1 cm², and an area of the region in which the second gate electrode may be disposed as shown in FIG. 2 and an area of the region in which the second gate electrode is not disposed as shown in FIG. 3 may be respectively set to about 30% and 70% with respect to the entire area thereof.

TABLE 1

| | | Breakdown voltage (V) | Current density (A/cm²) | Device area (cm²) | Current amount (A) |
|---|---|---|---|---|---|
| Comparative Example 1 | | 1107 | 296.8 | 0.5 | 148.4 |
| Comparative Example 2 | | 1078 | 543.8 | 0.5 | 271.9 |
| Exemplary Embodiment: Diode region operation | In FIG. 2 | 1097 | 125.5 | 1 | 37.7 Sum: |
| | In FIG. 3 | | 239.1 | | 167.4  205.1 |
| Exemplary Embodiment: MOSFET region operation | In FIG. 2 | | 541.8 | | 162.5 Sum: |
| | In FIG. 3 | | 300.8 | | 210.6  373.1 |

Referring to Table 1, the breakdown voltages of the semiconductor devices of the present exemplary embodiment and Comparative Examples 1 and 2 are substantially similar. For example, the current amount of the diode region operation of the semiconductor device of the present exemplary embodiment increases by about 38% with respect to that of the diode region operation of the semiconductor device of Comparative Example 1. Moreover, the current amount of the MOSFET region operation of the semiconductor device of the present exemplary embodiment increases by about 37% with respect to that of the diode region operation of the semiconductor device of Comparative Example 2.

The sum area of the semiconductor devices of Comparative Examples 1 and 2 is the same as the area of the semiconductor device of the present exemplary embodiment. In particular, the sum of the current amount of the semiconductor device of the present exemplary embodiment increases by about 37% with respect to that of the semiconductor devices of Comparative Examples 1 and 2. Thus, when the current amount of the semiconductor device of the present exemplary embodiment is the same as that of the semiconductor devices of Comparative Examples 1 and 2, the area of the semiconductor device of the present exemplary embodiment may be reduced by about 37% with respect to that of the semiconductor devices of Comparative Examples 1 and 2.

A manufacturing method of the semiconductor device will now be described with respect to FIG. 4 to FIG. 8, and FIG. 2. FIGS. 4 to 8 respectively illustrate a schematic diagram of a manufacturing method of the semiconductor device of FIG. 1. Herein, FIGS. 4 to 8 are exemplary drawings of the manufacturing method with respect to the region in which the second gate electrode may be disposed. The constituent elements formed in the region in which the second gate electrode is disposed may be formed in the region in which the second gate electrode is not disposed.

Figure 4:
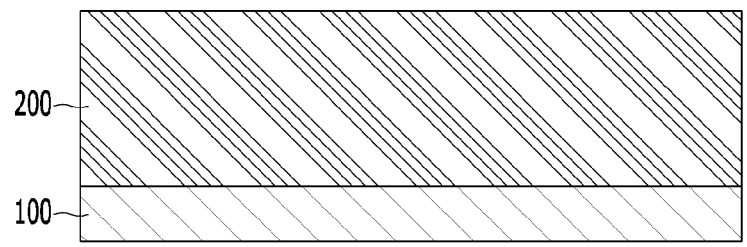
FIGS. 4 to 8 respectively illustrate exemplary schematic diagram of a manufacturing method of a semiconductor device according to an exemplary embodiment of the present invention.
Figure 5:
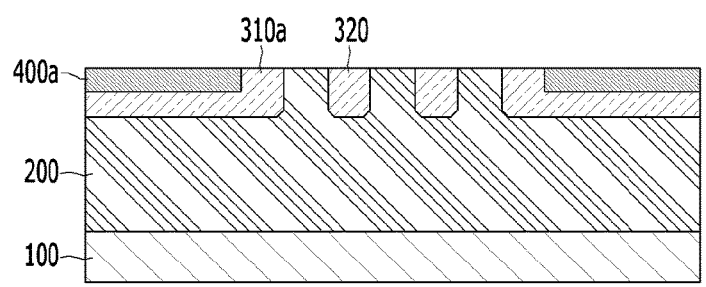

Referring to FIG. 4, the n+ type silicon carbide substrate 100 may be prepared, and the n− type layer 200 may be formed on the first surface of the n+ type silicon carbide substrate 100 by epitaxial growth. Referring to FIG. 5, a first preparation p type region 310a and the second p type region 320 may be formed by injecting p ions into the n− type layer 200 while using a mask (not shown). Then a preparation n+ type region 400a may be formed by injecting n+ ions into the first preparation p type region 310a while using a mask (not shown). In particular, the first preparation p type region 310a and the second p type region 320 may be formed to be spaced apart from each other.

Figure 6:
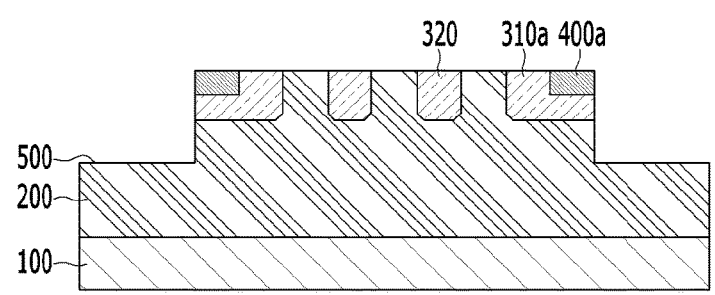
Figure 7:
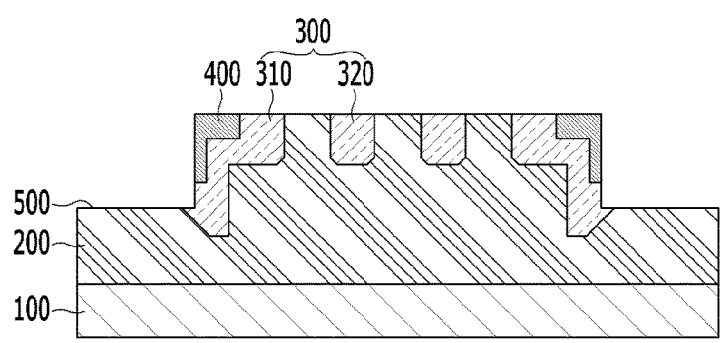
Figure 8:
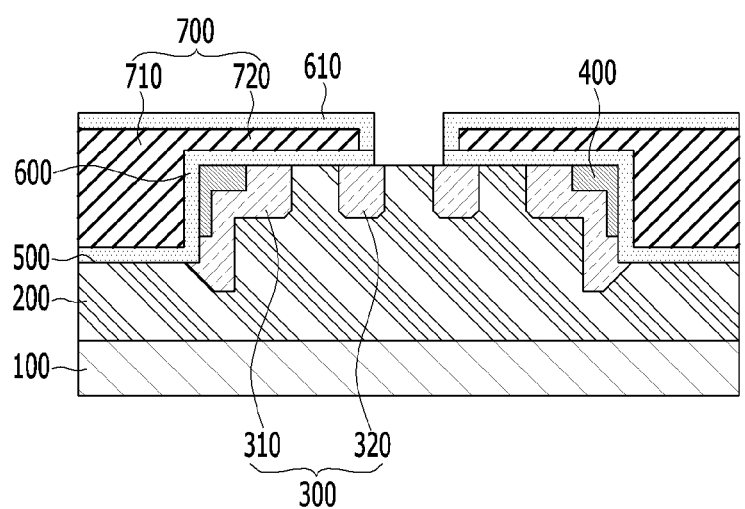

Referring to FIG. 6, the trench 500 may be formed by etching a portion of the first preparation p type region 310a, a portion of the preparation n+ type region 400a, and a portion of the n− type layer 200. Referring to FIG. 7, the first p type region 310 may be formed by injecting p ions into the lateral surface of the trench 500, and then the n+ type region 400 may be formed by injecting n+ ions into the lateral surface of the trench 500. In particular, the p ions and the n+ ions may be injected by a tilt ion injecting method. The tilt ion injecting method may include an injecting angle less than about 90 degrees with respect to a horizontal surface. Referring to FIG. 8, the gate insulating layer 600 may be formed at the trench 500, and then the gate electrode 700 may be formed on the gate insulating layer 600.

The gate insulating layer 600 may extend from the trench 500 to an upper surface of the second p type region 320 adjacent to the first p type region 310, and the gate electrode 700 may include the second gate electrode 720 that extends from the first gate electrode 710. As shown in FIG. 1, a plurality of second gate electrodes 720 may be formed to be spaced apart from each other. In other words, the gate insulating layer 600 may not be formed in the region in which the second gate electrode 720 is not disposed. Next, the oxide layer may be formed on the gate electrode 700.

Figure 9:
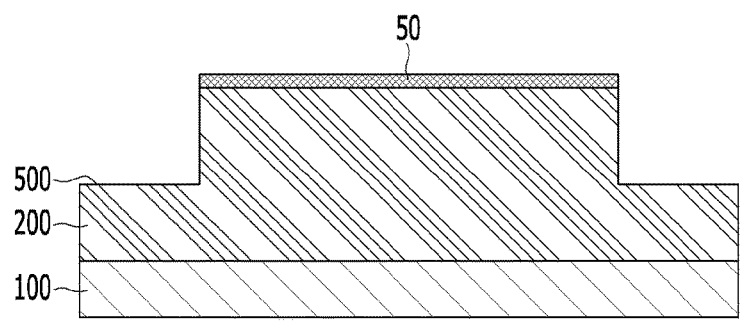
FIGS. 9 to 11 respectively illustrate exemplary schematic diagram of a manufacturing method of a semiconductor device according to an exemplary embodiment of the present invention.
Figure 10:
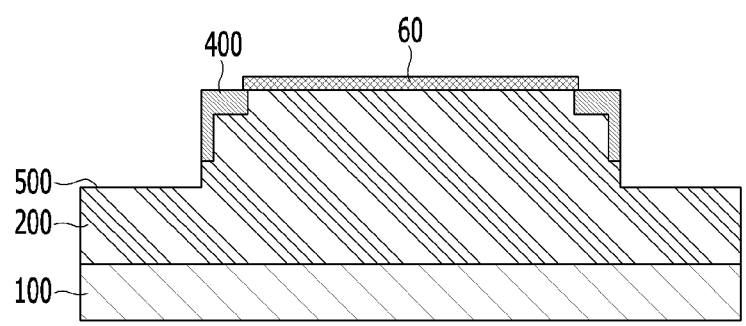
Figure 11:
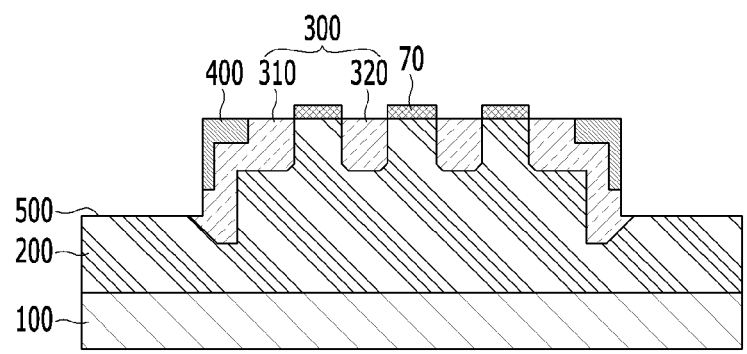

Referring to FIG. 1, the source electrode 800 may be formed on the oxide layer 610 and the second p type region 320, and the drain electrode 900 may be formed on the second surface of the n+ type silicon carbide substrate 100. In the manufacturing method of the semiconductor device according to the exemplary embodiment of the present invention as shown in FIG. 4 to FIG. 8, the trench may be formed after injecting the p ions and the n+ ions, but the p ions and the n+ ions may be injected after forming the trench. This will now be described with reference to FIG. 9 to FIG. 11, and FIG. 1. FIGS. 9 to 11 respectively illustrate an exemplary schematic diagram of a manufacturing method of the semiconductor device of FIG. 1. Referring to FIG. 9, the n+ type silicon carbide substrate 100 may be prepared, the n− type layer 200 may be formed on the first surface of the n+ type silicon carbide substrate 100 by epitaxial growth, and then the trench 500 may be formed by etching the n− type layer 200 while using a first mask 50.

Referring to FIG. 10, after elimination of the first mask 50, the n+ type region 400 may be formed by injecting n+ ions on the n− type layer 200 and at the lateral surface of the trench 500 using a second mask 60. In particular, the n+ ions may be injected by a tilt ion injecting method. Referring to FIG. 11, after eliminating the second mask 60, the p type region 300 may be formed by injecting p ions on the n− type layer 200 and at the lateral surface of the trench 500 while using a third mask 70.

The p type region 300 may include the first p type region 310 formed at the lateral surface of the trench 500 and the second p type region 320 may be formed to be spaced apart from the first p type region 310. Subsequently, after eliminating the third mask 70, the gate insulating layer 600, the gate electrode 700, and the oxide layer 610 may be formed with the manufacturing process of FIG. 8. Referring to FIG. 1, the source electrode 800 may be formed on the oxide layer 610 and the second p type region 320, and the drain electrode 900 may be formed on the second surface of the n+ type silicon carbide substrate 100.

While this invention has been described in connection with what is presently considered to be an exemplary embodiment, it is to be understood that the invention is not limited to the disclosed exemplary embodiments, but, on the contrary, is intended to cover various modifications and equivalent arrangements included within the spirit and scope of the appended claims.

DESCRIPTION OF SYMBOLS

100: n+ type silicon carbide substrate
200: n− type layer
300: p type region
310: first p type region
320: second p type region
400: n+ type region
500: trench
600: gate insulating layer
700: gate electrode
710: first gate electrode
720: second gate electrode
800: source electrode
900: drain electrode

What is claimed is:

1. A semiconductor device, comprising:
an n− type layer disposed on a first surface of an n+ type silicon carbide substrate;
a trench disposed within the n− type layer;
an n+ type region and a first p type region disposed at the n− type layer and at a lateral surface of the trench;
a plurality of second p type regions disposed at the n− type layer and are spaced apart from the first p type region;
a gate electrode that includes a first gate electrode disposed at the trench and a plurality of second gate electrodes that extend from the first gate electrode;
a source electrode disposed on the gate electrode and insulated from the gate electrode; and
a drain electrode disposed on a second surface of the n+ type silicon carbide substrate,
wherein the plurality of second p type regions are spaced apart from each other, and the source electrode contacts the plurality of second p type regions and the n− type layer disposed between the plurality of second p type regions,
wherein the semiconductor device comprises a MOSFET region and a diode region,
wherein the MOFET region comprises the n− type layer, the first p type region, the n+ type region, the first gate electrode, the second gate electrode, the source electrode, and the drain electrode,
wherein the diode region comprises the n− type layer, the first p type region, the second p type regions, the source electrode, and the drain electrode, and
wherein the plurality of second gate electrodes extend from the first gate electrode to an upper portion of the second p type region adjacent to the first p type region.

2. The semiconductor device of claim 1, further comprising:
a gate insulating layer disposed under the first gate electrode and the plurality of second gate electrodes.

3. The semiconductor device of claim 2, wherein the gate insulating layer is disposed between the first gate electrode and the trench, and between the plurality of second gate electrodes and the n+ type region, the first p type region, and an upper portion of the second p type region adjacent to the first p type region.

4. The semiconductor device of claim 3, wherein the plurality of second gate electrodes are spaced apart from each other.

5. The semiconductor device of claim 4, wherein the n− type layer, the first p type region, and the plurality of second p type regions are disposed between the plurality of second gate electrodes.

6. The semiconductor device of claim 5, wherein a Schottky electrode contacts the n− type layer disposed between the plurality of second gate electrodes, the first p type region, and the plurality of second p type regions.

7. The semiconductor device of claim 1, wherein the first p type region surrounds a corner of the trench, and extends to a bottom surface of the corner of the trench.

* * * * *